United States Patent

Mitsui

[11] Patent Number: 5,804,337
[45] Date of Patent: Sep. 8, 1998

[54] PHASE SHIFT MASK AND PHASE SHIFT MASK BLANK

[75] Inventor: Masaru Mitsui, Yamanashi, Japan

[73] Assignee: Hoya Corporation, Tokyo, Japan

[21] Appl. No.: 744,747

[22] Filed: Nov. 6, 1996

Related U.S. Application Data

[62] Division of Ser. No. 493,280, Jun. 21, 1995, Pat. No. 5,635,315.

[51] Int. Cl.$^6$ .................................................. G03F 9/00
[52] U.S. Cl. .................................. 430/5; 428/432
[58] Field of Search .................. 430/5, 322; 204/192.11, 204/192.12; 428/432

[56] References Cited

U.S. PATENT DOCUMENTS

| | | | |
|---|---|---|---|
| 5,409,789 | 4/1995 | Ito | 430/5 |
| 5,422,205 | 6/1995 | Inoue et al. | 430/5 |
| 5,429,897 | 7/1995 | Yoshioka et al. | 430/5 |
| 5,464,713 | 11/1995 | Yoshioka et al. | 430/5 |
| 5,605,776 | 2/1997 | Isao et al. | 430/5 |
| 5,629,114 | 5/1997 | Isao et al. | 430/5 |
| 5,631,109 | 5/1997 | Ito | 43/5 |

FOREIGN PATENT DOCUMENTS 4136854  11/1992  Japan .

*Primary Examiner*—S. Rosasco
*Attorney, Agent, or Firm*—Sughrue, Mion, Zinn, Macpeak & Seas, PLLC

[57] ABSTRACT

A phase shift mask comprises a transparent substrate (1) provided with a mask pattern formed by a light transmitting portion (4) for transmitting effective light beams having an intensity which substantially contributes to exposure and a light translucent portion (2) for transmitting ineffective light beams having an intensity which does not substantially contribute to exposure. The light translucent portion (2) is for phase shifting the ineffective light beams transmitted therethrough to make the ineffective light beams be different in phase from the effective light beams transmitted through the light transmitting portion (4) that the effective and the ineffective light beams passing through an area in the vicinity of a boundary between the light transmitting portion (4) and the light translucent portion (2) cancel each other so as to assure an excellent contrast at the boundary. The light translucent portion (2) comprises a thin film made of a material containing oxygen, metal, and silicon as main components.

28 Claims, 3 Drawing Sheets

PHASE SHIFT MASK AND PHASE SHIFT MASK BLANK

This is a divisional of application Ser. No. 08/493,280 filed Jun. 21, 1995 now U.S. Pat. No. 563,535.

BACKGROUND OF THE INVENTION

This invention relates to a phase shift mask capable of improving a resolution of a transfer pattern by imparting a phase difference to exposure light beams passing through the mask and to a phase shift mask blank from which the phase shift mask is made. More particularly, this invention relates to a phase shift mask of a so-called halftone type and a phase shift mask blank from which the phase shift mask is made.

To manufacture a semiconductor LSI, use is made of a phase shift mask which is known as one of photomasks for transferring a fine pattern. The phase shift mask imparts a phase difference to exposure light beams passing through the mask to thereby improve a resolution of a transfer pattern. As one of those phase shift masks of the type described, Japanese Patent Publication (A) H04-136854 discloses a phase shift mask which is particularly adapted to transfer an isolated pattern such as a single hole, dot, or line.

In the phase shift mask disclosed in the above-referenced publication, a mask pattern formed on a transparent substrate comprises a light transmitting portion and a light translucent portion. The light transmitting portion transmits effective light beams having an intensity which substantially contributes to exposure. On the other hand, the light translucent portion transmits ineffective light beams having an intensity which does not substantially contributes to exposure. The ineffective light beams passing through the light translucent portion are shifted in phase so that the ineffective light beams passing through the light translucent portion have a phase substantially reverse to that of the effective light beams passing through the light transmitting portion. In this arrangement, the effective and the ineffective light beams passing through an area in the vicinity of a boundary between the light transmitting portion and the light translucent portion cancel each other. It is therefore possible to assure an excellent contrast at the boundary. The phase shift mask described above is called a halftone type. In this phase shift mask, the light translucent portion has both a light shielding function of substantially shielding the effective light beams and a phase shift functiom of shifting the phase of the ineffective light beams. Accordingly, it is unnecessary to separately form a light shielding film pattern and a phase shift film pattern. Thus, the phase shift mask is simple in structure and easy in manufacture.

In the meanwhile, the light translucent portion in the above-mentioned phase shift mask of a halftone type is required to have optimum values for both a light transmissivity and phase shift ability. If the light translucent portion is formed by a single material, both of the above-mentioned requirements must simultaneously be fulfilled by selecting its thickness. However, an appropriate material fully satisfying such requirements has not yet been developed so far.

In view of the above, a proposal is made of an improved light translucent portion of a multilayer structure comprising a plurality of kinds of materials in the form of a high-transmissivity layer and a low-transmissivity layer. The low-transmissivity layer mainly serves to adjust the light transmissivity to a predetermined value. On the other hand, the high-transmissivity layer mainly serves to adjust an amount of the phase shift. With this structure, it is readily possible to adjust both the light transmissivity and the phase shift amount to optimum values. FIGS. 1 and 2 show phase shift masks each of which has a light translucent portion of a multilayer structure. Referring to FIG. 1, the phase shift mask comprises a transparent substrate 10, a stopper film 11 formed on the transparent substrate 10, a SOG (spin on glass) film 12 formed on the stopper film 11 to serve as the high-transmissivity layer, and a chromium film 13 formed on the SOG film 12 to serve as the low-transmissivity layer. Referring to FIG. 2, the phase shift mask comprises the transparent substrate 10, the chromium film 13 formed on the transparent substrate 10, and the SOG film 12 formed on the chromium film 13.

However, the above-described phase shift masks with the light translucent portions of a multilayer structure have following disadvantages.

As described above, the high-transmissivity layer and the low-transmissivity layer are made of SOG and chromium, respectively. Therefore, when etching is carried out to form a mask pattern, it is required to use different kinds of etching media for the SOG film 12 and the chromium film 13 as the high-transmissivity layer and the low-transmissivity layer, respectively. It is assumed that both the SOG film 12 and the chromium film 13 are subjected to dry etching in order to suppress occurrence of side etch. In this event, the SOG film 12 as the high-transmissivity layer is etched by the use of a series of fluoride etching gases such as $CF_4$, $CHF_3$, $SF_6$, $C_2F_6$, $NF_3$, $CF_4+H_2$, $CBrF_3$. On the other hand, the chromium film 13 as the low-transmissivity layer is etched by a series of chlorine gases such as $CCl_4$ and $Cl_2$. If both of the films are successively etched in a same etching apparatus, one etching gas used earlier may remain in the apparatus to be mixed with the other etching gas used later. This possibly results in disturbance of etching conditions. In order to eliminate the possibility of such disturbance, it is proposed to etch those films in separate etching apparatuses. In this event, however, an additional etching apparatus is required and the substrate must be moved from one etching apparatus to the other. Furthermore, during the movement, foreign particles such as dust may be attracted onto the substrate to cause a defective pattern to be formed. In addition, the SOG film has a low refractive index and must therefore be relatively thick. This means that the mask pattern has a large step height. As a result, the mask pattern is readily damaged during washing and washability is insufficient to remove the foreign particles attracted thereto.

SUMMARY OF THE INVENTION

It is therefore an object of this invention to provide a phase shift mask which is manufactured in a relatively simple process with occurrence of a very small defect minimized and which is capable of transferring a pattern with a high resolution.

It is another object of this invention to provide a method of manufacturing a phase shift mask blank from which a phase shift mask of the type described is made.

Other objects of this invention will become clear as the description proceeds.

A phase shift mask to which this invention is applicable is for use in exposing a pattern and comprises a transparent substrate provided with a mask pattern formed by a light transmitting portion for transmitting effective light beams having an intensity which substantially contributes to exposure and a light translucent portion for transmitting ineffective light beams having an intensity which does not substantially contribute to exposure. The light translucent portion is for phase shifting the ineffective light beams transmitted therethrough to make the ineffective light beams be different in phase from the effective light beams transmitted through the light transmitting portion so that the effective and the ineffective light beams passing through an area in the vicinity of a boundary between the light transmitting portion and the light translucent portion cancel each other so as to assure an excellent contrast at the boundary.

According to this invention, the light translucent portion comprises a thin film made of a material containing oxygen, metal, and silicon as main components.

Preferably, the metal contained in the material of the thin film is molybdenum.

Preferably, the thin film contains 35 to 60 at % oxygen.

Preferably, the material of the thin film contains nitrogen as an additional component.

Preferably, the thin film contains nitrogen and oxygen in a ratio between 1:5 and 1:2.

Preferably, the thin film contains a variable content of oxygen varying in a thickness direction so that the content is greater in the vicinity of a surface of the thin film than in a remaining part.

A phase shift mask blank to which this invention is applicable is for use as a blank from which a phase shift mask of the type described is made.

According to this invention, the phase shift mask blank comprises a transparent substrate and a thin film formed on the transparent substrate and made of a material containing oxygen, metal, and silicon as main components.

Preferably, the metal contained in the material of the thin film is molybdenum.

As described above, the light translucent portion comprises the thin film made of the material containing oxygen, metal, and silicon as main components. With this structure, although the light translucent portion comprises a single-layer film made of a single material, it is readily possible to simultaneously satisfy the requirements for the optimum values both in the light transmissivity and in the phase shift ability. The present inventors have found the fact that the thin film made of the material containing oxygen, metal (for example, molybdenum, tantalum, or tungsten), and silicon as main components is adapted to form the light translucent portion. The light translucent portion comprising the single-layer film can be manufactured in an extremely simple process. Since the thin film has a high refractive index, the film thickness is rendered extremely small so that the mask pattern has a reduced step height. Accordingly, the mask pattern is prevented from being damaged during washing and the washability is improved to effectively remove foreign particles.

When the metal contained in the material of the thin film is molybdenum, the above-mentioned effects of this invention are most remarkable.

When the thin film contains 35 to 60 at % oxygen, it is possible to obtain the light translucent portion having an excellent characteristic.

When the material of the thin film contains nitrogen as an additional component, it is possible to improve an acid resistance of the thin film forming the light translucent portion as well as to selectively etch with a high precision in dry etching of the thin film. Accordingly, the phase shift mask is easily manufactured.

When the thin film forming the light translucent portion contains a variable content of oxygen, only a surface portion accessed by acid is formed by a material containing a greater content of nitrogen to be rich in acid resistance but low in light transmissivity. On the other hand, an internal portion is formed by a different material containing a greater content of oxygen to be poor in acid resistance but high in light transmissivity. Thus, the light transmitting portion assures the optimum light transmissivity as required and still has a sufficient acid resistance.

The phase shift mask blank having the above-mentioned structure can be used as a blank from which the phase shift mask of the type described is made.

DESCRIPTION OF THE PREFERRED EMBODIMENTS

Figure 1:
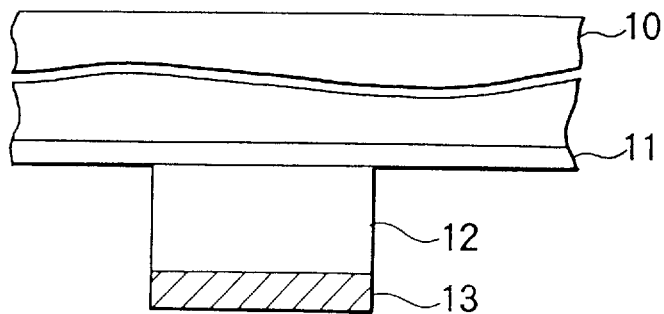
FIG. 1 is a partial sectional view of a conventional phase shift mask of a double layer structure.
Figure 2:
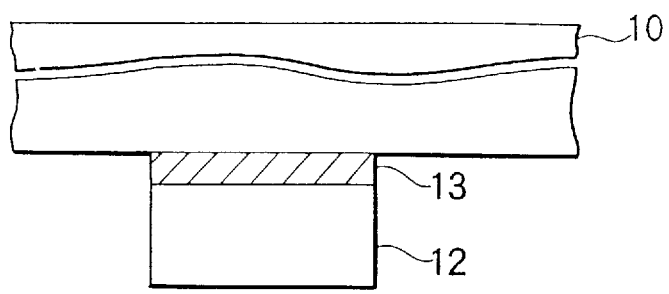
FIG. 2 is a partial sectional view of another conventional phase shift mask of a double layer structure.

Description will now be made as regards this invention with reference to the drawing.

Figure 3:
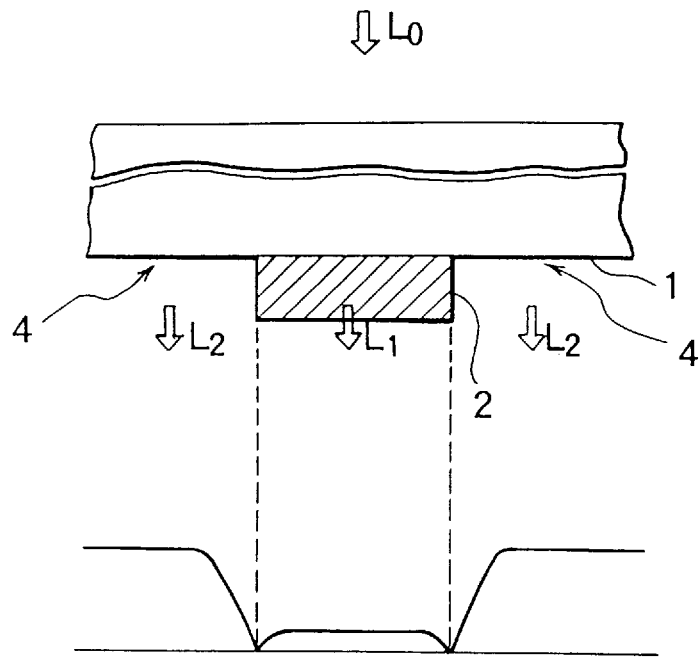
FIG. 3 is a partial sectional view of a phase shift mask according to one embodiment of this invention.
Figure 4:
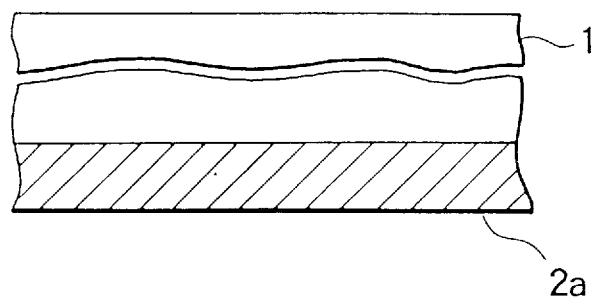
FIG. 4 is a partial sectional view of a phase shift mask blank according to one embodiment of this invention.

FIGS. 3 and 4 show a phase shift mask and a phase shift mask blank according to an embodiment of this invention, respectively.

At first referring to FIG. 3, the phase shift mask comprises a transparent substrate 1, a light translucent portion 2 formed on the transparent substrate 1, and a light transmitting portion 4.

The transparent substrate 1 is made of silica glass and has top and bottom principal surfaces subjected to mirror polishing. The transparent substrate 1 has a length of 5 inches, a width of 5 inches, and a thickness of 0.09 inches.

The light translucent portion 2 comprises a thin film made of a material (for example, MoSiO) containing oxygen, molybdenum, and silicon as main components or another material (for example, MoSiON) containing nitrogen as an additional component in addition to oxygen, molybdenum, and silicon. In this embodiment, a marcury lamp is used as an exposure light source to emit as an exposure light beam an i-ray having a wavelength ($\lambda$) equal to 365 nm. The light translucent portion 2 has an oxygen content (at %), a nitrogen content (at %), a thickness d (A), and a light transmissivity which are selected so that the light translucent portion 2 has a predetermined phase shift amount ($\phi$) and a predetermined light shielding ability with respect to the exposure light beam.

In this case, the thickness d is given by:

$$d = (\phi/360) \times \{\lambda/(n-1)\}, \tag{1}$$

where n represents a refractive index of the light translucent portion 2.

In Equation (1), the phase shift amount ($\phi$) is preferably equal to 180°. Practically, the phase shift amount ($\phi$) within a range between 160° and 200° is sufficient. Generally, the light transmissivity of the light translucent portion 2 with respect to the exposure light beam is preferably within a range between 2% and 20%, although it depends upon a sensitivity of a resist used in forming a mask pattern. The light transmissivity of the light translucent portion 2 is adjusted by selecting the oxygen content or the oxygen and the nitrogen contents of the thin film forming the light translucent portion 2.

Various samples of the thin film forming the light translucent portion 2 were prepared at various contents of oxygen and at various contents of oxygen and nitrogen. Table 1 shows characteristics of the samples (Nos. 1 through 9) thus prepared. An acid resistance test was carried out by immersion in a hot dense sulfuric acid solution ($H_2SO_4$) at a temperature of 120° C. for two hours. In Table 1, reference symbols ○ and Δ represent that no variation in acid resistance was observed and that variation within an allowable range was observed, respectively.

TABLE 1

| Sample No. | Oxygen Content (at %) | Nitrogen Content (at %) | Transmissivity of i-ray (%) | Acid Resistance | Sheet Resistance (KΩ/□) |
|---|---|---|---|---|---|
| 1 | 40 | 0 | 6 | ○ | 20 |
| 2 | 45 | 0 | 10 | ○ | 20 |
| 3 | 50 | 0 | 15 | Δ | 70 |
| 4 | 40 | 18 | 3 | ○ | 30 |
| 5 | 45 | 20 | 7 | ○ | 50 |
| 6 | 50 | 22 | 10 | ○ | 70 |
| 7 | 55 | 17 | 15 | Δ | 100 |
| 8 | 60 | 13 | 18 | Δ | 200 |
| 9 | surface 43 bottom 50 | 20 17 | 15 | ○ | 30 |

In Samples Nos. 1 through 3, the light translucent portion 2 comprises a thin film made of MoSiO. In Samples Nos. 4 through 9, the light translucent portion 2 comprises a thin film made of MoSiON. In Sample No. 9, the thin film has a variable oxygen content varied in a thickness direction. Specifically, the oxygen content is smaller in the vicinity of a surface of the thin film than in a remaining part.

Next referring to FIG. 4, description will proceed to a manufacturing process of the phase shift mask having the above-mentioned structure.

As illustrated in FIG. 4, a light translucent film 2a comprising the thin film made of MoSiO (Samples Nos. 1 through 3) or MoSiON (Samples Nos. 4 through 9) is formed on the surface of the transparent substrate 1 to obtain a phase shift mask blank.

When the light translucent film 2a comprises the thin film made of MoSiO as in Samples Nos. 1 through 3, the light translucent film 2a is formed in the manner which will presently be described.

By the use of a composite target comprising molybdenum (Mo) and silicon (Si) in a mol ratio of 1:2, reactive sputtering is carried out in a mixed gas atmosphere containing argon (Ar) between 90% and 80% and oxygen ($O_2$) between 10% and 20% and having a pressure of $1.5 \times 10^{-3}$ Torr. As a result, the thin film having a thickness between 1400 Å and 2000 Å is deposited on the transparent substrate 1. In Sample No. 2, the thin film having a thickness of 2000 Å was formed in the mixed gas atmosphere containing 85% argon (Ar) and 15% oxygen ($O_2$). In this case, the thickness is selected so that the phase difference is equal to 180°.

On the other hand, when the light translucent film 2a comprises the thin film made of MoSiON as in Samples Nos. 4 through 9, the light translucent film 2a is manufactured as follows.

Figure 5:
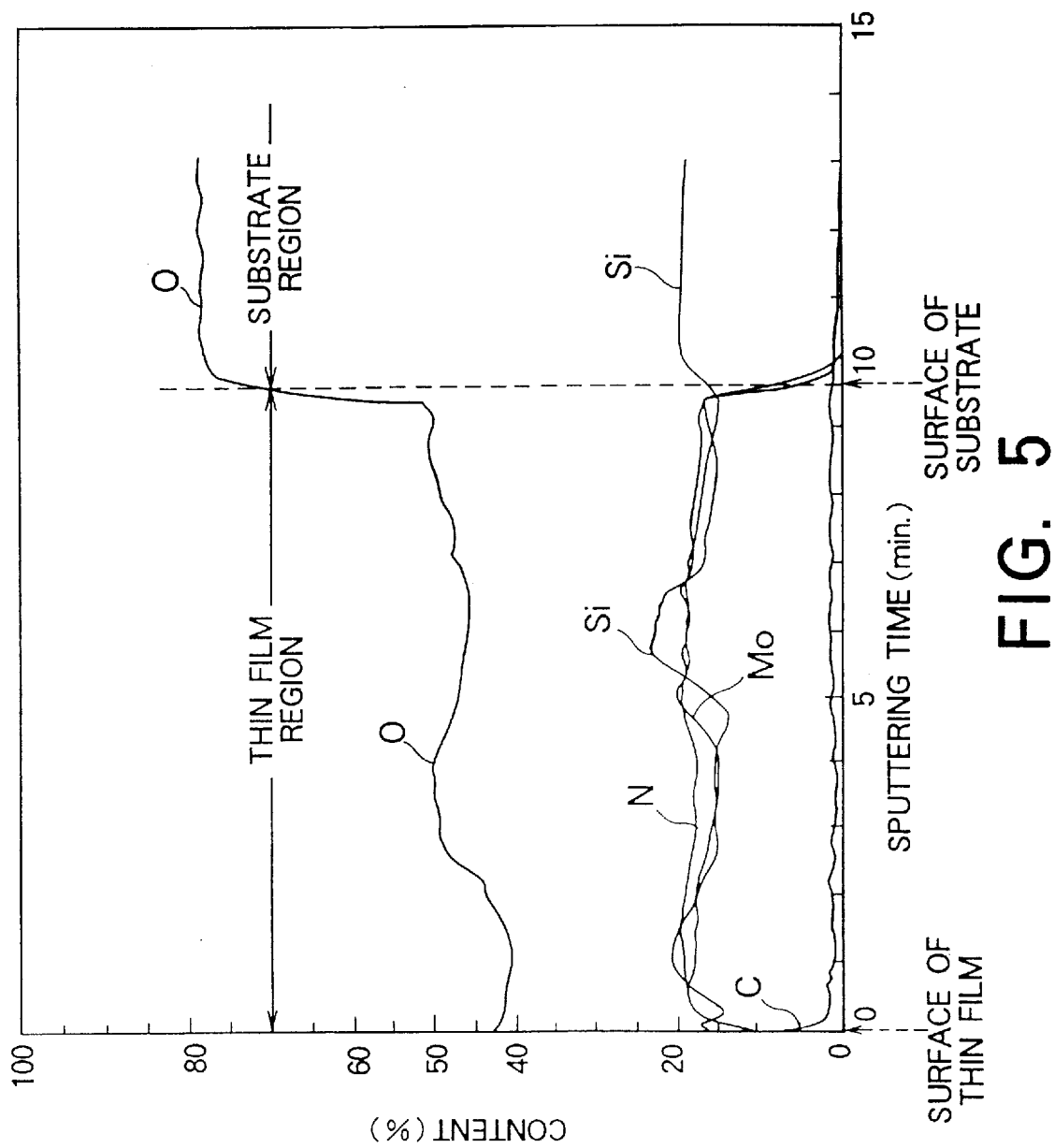
FIG. 5 is a graph showing a result of analysis upon a composition of a light translucent film used in this invention.

By the use of a composite target comprising molybdenum (Mo) and silicon (Si) in a mol ratio of 1:2, reactive sputtering is carried out in a mixed gas atmosphere containing argon (Ar) between 84% and 72% and nitrogen monoxide ($N_2O$) between 16% and 28% and having a pressure of $1.5 \times 10^{-3}$ Torr. As a result, the thin film having a thickness between 1400 Å and 2000 Å is deposited on the transparent substrate 1. In Sample No. 4, the thin film having a thickness of 1400 Å was formed in the mixed gas atmosphere containing 84% argon (Ar) and 16% nitrogen monoxide ($N_2O$). In this case, NO or $O_2+N_2$ may be used instead of nitrogen monoxide ($N_2O$). In Sample No. 9, a partial pressure of argon (Ar) was controlled to provide the variable oxygen content varied in the thickness direction. FIG. 5 shows a result of analysis upon a composition of the light translucent film of Sample No. 9 as analyzed by the Auger analyzer. In the figure, an ordinate and an abscissa represent the content (%) of each element and a sputtering time (minute), respectively. It is noted here that the sputtering time corresponds to a position in the thickness direction.

Subsequently, a resist film is formed on the light translucent film 2a of the phase shift mask blank thus obtained. Then, the phase shift mask blank with the resist film is subjected to a known pattern forming process comprising a series of steps of exposing, developing, etching, washing, and so on. As a consequence, a part of the light translucent film 2a is removed to obtain the phase shift mask having a hole or dot pattern formed by the light transmitting portion 4 and the light translucent portion 2. If the MoSiO film or the MoSiON film is etched by dry etching, a $CF_4+O_2$ mixture is used as an etching gas.

Referring to FIG. 3, it is assumed that exposure light beams L0 are irradiated to the phase shift mask. In this event, the exposure light beams L0 are separated into first light beams L1 and second light beams L2. The first light beams L1 pass through the light translucent portion 2 to reach a transfer object not illustrated in the figure. The second light beams L2 pass through the light transmitting portion 4 to reach the transfer object. In this case, the first light beams L1 passing through the light translucent portion 2 have a weak intensity which does not substantially contribute to exposure. On the other hand, the second light beams L2 passing through the light transmitting portion 4 have a strong intensity which substantially contributes to exposure. In this arrangement, exposure of the pattern is carried out. During the exposure, those of the first and the second light beams which pass through a boundary area between the light translucent portion 2 and the light transmitting portion 4 leak into the other side due to diffraction. However, those of the first and the second light beams cancel each other because the first and the second light beams are generally reverse in phase to each other. As a result, the light intensity on the transfer object is substantially equal to zero at a site corresponding to the boundary area. Accordingly, a boundary is extremely definitely delineated so as to improve a resolution.

According to the above-mentioned embodiment, the light translucent portion 2 comprises the thin film made of the material containing oxygen, molybdenum, and silicon as main components. With this structure, it is possible to simultaneously satisfy the requirements for the optimum values both in the light transmissivity and in the phase shift ability although the light translucent portion 2 has a single layer structure instead of a multilayer structure. Because of such a single layer structure, the manufacturing process is very simple. In addition, the thickness of the thin film can be rendered extremely small because the thin film has a high refractive index. Therefore, according to this invention, the mask pattern has a reduced step height as small as a half or one third as compared with the conventional phase shift mask having a double layer structure comprising the SOG film and the chromium film. With such a reduced step height, the mask pattern is prevented from being damaged during washing and washability is improved to effectively remove foreign particles. Furthermore, the thin film made of the material containing oxygen,, molybdenum, and silicon as main components can easily be formed not only by sputtering but also by other common deposition techniques such as vapor deposition. The light transmissivity and the acid resistance can be controlled as desired by adjusting the oxygen content or the oxygen and the nitrogen contents. Still more, a precision in selective etching is improved in dry etching. Thus, the light translucent portion having a desired characteristic is relatively easily obtained.

Since a film stress of the thin film is small, it is possible to suppress a distortion of the mask and to assure tight contact between the thin film and the transparent substrate such as a quartz substrate.

As the metal component of the material forming the light translucent portion, tantalum or tungsten may be used instead of molybdenum mentioned above.

In the foregoing embodiment, the mercury lamp is used as the exposure light source to emit, as the exposure light beam, the i-ray having a wavelength of 365 nm. It is noted here that use can be made of a different exposure light beam having a different wavelength, for example, a g-ray (436 nm) or a KrF excimer laser beam (248 nm). In such an event, the oxygen content, the nitrogen content, and the film thickness are adjusted in correspondence to the refractive index and the absorption index of the thin film with respect to the wavelength of each exposure light beam.

As thus far been described, according to this invention, the light translucent portion comprises the thin film made of the material containing oxygen, molybdenum, and silicon as main components. With this structure, it is possible to simultaneously satisfy the requirements for the optimum values both in the light transmissivity and in the phase shift ability although the light translucent portion comprises a single-layer film made of a single material. Because the light translucent portion comprises such a single-layer film, the manufacturing process is very simple. In addition, the thickness of the thin film can be rendered extremely small because the thin film has a high refractive index. Therefore, according to this invention, the mask pattern has a reduced step height so that the mask pattern is prevented from being damaged during washing and washability is improved to effectively remove foreign particles. In addition, the thin film of the light translucent portion may include silicide composed of the silicon and the metal.

What is claimed is:

1. A method of manufacturing a phase shift mask blank, comprising the steps of:
    preparing a substrate transparent to an exposure light beam and a target comprising a metal and silicon;
    sputtering the target within an atmosphere of a mixed gas comprising argon gas and $N_2O$ gas, to deposit onto the transparent substrate, a translucent phase shift film which comprises the metal, oxygen, nitrogen, and silicon.

2. A method as claimed in claim 1, wherein said mixed gas includes 84% to 72% of the argon and 16% to 28% of a selected one of NO and $N_2O$.

3. A method as claimed in claim 1, wherein the mixed gas includes 84% to 72% of the argon and 16% to 28% of $N_2O$.

4. A method as claimed in claim 1, where the sputtering step is carried out by controlling a pressure of the said mixed gas so that an amount of oxygen is decreased from a back surface of said phase shift layer to a front surface along a thickness direction.

5. A method as claimed in claim 1, wherein said metal comprises molybdenum.

6. A method as claimed in claim 5, wherein the target includes molydenum and silicon in a mol ratio of 1:2.

7. A method as claimed in claim 1, wherein the sputtering step is reactive sputtering.

8. A method as claimed in claim 1, wherein the sputtering step comprises the steps of:
    controlling a pressure of the mixed gas so that the translucent phase shift film has a content distribution of the oxygen in a direction of a thickness such that the content of the oxygen becomes lower at a portion adjacent to a surface of the translucent phase shift film in comparison with a portion remote from the surface.

9. A method as claimed in claim 8, wherein the metal comprises molybdenum.

10. A method as claimed in claim 8, wherein the sputtering step is carried out by the use of a reactive sputtering technique.

11. A method as claimed in claim 10, wherein the target includes molybdenum and silicon at a rate of 1:2.

12. A method of manufacturing a phase shift mask, comprising the steps of:
    preparing a substrate transparent to an exposure light beam and a target including metal and silicon;
    locating the transparent substrate and the target within an atmosphere of a mixed gas which comprises argon gas and $N_2O$;
    sputtering the target within the atmosphere onto the transparent substrate to deposit a translucent phase shift film which includes the metal, oxygen, nitrogen, and the silicon; and
    selectively etching the translucent phase shift film by the use of a photolithography technique to obtain the phase shift mask.

13. A method of manufacturing a phase shift mask blank, comprising the steps of:
    preparing a substrate transparent to an exposure light beam and a target including metal and silicon;
    locating the transparent substrate and the target within an atmosphere of a mixed gas which includes an oxygen gas and a nitrogen gas;
    adjusting amounts of the oxygen and the nitrogen within the mixed gas so that a translucent phase shift film deposited has a ratio of nitrogen to oxygen which falls within a range between 0.2 and 0.5; and
    sputtering the target within the mixed gas adjusted onto the transparent substrate to deposit said translucent phase shift film which includes the metal, the oxygen, the nitrogen, and the silicon and which includes the nitrogen and the oxygen at the above-mentioned ratio.

14. A method as claimed in claim 13, wherein the sputtering step comprises the steps of:
    controlling a pressure of the mixed gas so that the translucent phase shift film has a content distribution of the oxygen in a direction of a thickness such that the content of the oxygen becomes lower at a portion adjacent to a surface of the translucent phase shift film in comparison with a portion remote from the surface.

15. A method as claimed in claim 13, wherein the metal comprises molybdenum.

16. A method as claimed in claim 13, wherein the sputtering step is carried out by the use of a reactive sputtering technique.

17. A method of manufacturing a phase shift mask blank, comprising the steps of:

preparing a substrate transparent to an exposure light beam and a target including metal and silicon;

locating the transparent substrate and the target within an atmosphere of a mixed gas which includes an oxygen gas and a nitrogen gas;

adjusting amounts of the oxygen and the nitrogen within the mixed gas so that a translucent phase shift film deposited includes 35 at % to 60 at % of oxygen; and sputtering the target within the mixed gas adjusted onto the transparent substrate to deposit said translucent phase shift film which includes the metal, the oxygen, the nitrogen, and the silicon and which includes 35 at % to 60 at % of the oxygen.

18. A method as claimed in claim 17, wherein the sputtering step comprises the steps of:

controlling a pressure of the mixed gas so that the translucent phase shift film has a content distribution of the oxygen in a direction of a thickness such that the content of the oxygen becomes lower at a portion adjacent to a surface of the translucent phase shift film in comparison with a portion remote from the surface.

19. A method as claimed in claim 17, wherein the metal comprises molybdenum.

20. A method as claimed in claim 17 wherein the sputtering step is carried out by the use of a reactive sputtering technique.

21. A method of manufacturing a phase shift mask blank, comprising the steps of:

preparing a substrate transparent to an exposure light beam and a target including metal and silicon, locating the transparent substrate and the target within an atmosphere of a mixed gas which includes an oxygen gas and a nitrogen gas;

adjusting amounts of the oxygen and the nitrogen within the mixed gas so that a translucent phase shift film deposited has a sheet resistance between 20 and 200K$\Omega$/□; and sputtering the target within the mixed gas adjusted onto the transparent substrate to deposit said translucent phase shift film including the metal, the oxygen, the nitrogen, and the silicon and which has the above-mentioned sheet resistance.

22. A method as claimed in claim 21, wherein the sputtering step comprises the steps of;

controlling a pressure of the mixed gas so that the translucent phase shift film has a content distribution of the oxygen in a direction of a thickness such that the content of the oxygen becomes lower at a portion adjacent to a surface of the translucent phase shift film in comparison with a portion remote from the surface.

23. A method as claimed in claim 21, wherein the metal comprises molybdenum.

24. A method as claimed in claim 21, wherein the sputtering step is carried out by the use of a reactive sputtering technique.

25. A method of manufacturing a phase shift mask, comprising the steps of:

preparing a substrate transparent to an exposure light beam and a target including metal and silicon;

locating the transparent substrate and the target within an atmosphere of a mixed gas which includes an argon gas and a selected one of NO and $N_2O$;

sputtering the target within the atmosphere onto the transparent substrate to deposit a translucent phase shift film which includes the metal, oxygen, nitrogen, and the silicon; and selectively etching the translucent phase shift film by the use of a photolithography technique to obtain the phase shift mask.

26. A method of manufacturing a phase shift mask, comprising the steps of:

preparing a substrate transparent to an exposure light beam and a target including metal and silicon;

locating the transparent substrate and the target within an atmosphere of a mixed gas which includes an oxygen gas and a nitrogen gas;

adjusting amounts of the oxygen and the nitrogen within the mixed gas so that a translucent phase shift film deposited includes 35 at % to 60 at % of oxygen;

sputtering the target within the mixed gas adjusted onto the transparent substrate to deposit said translucent phase shift film which includes the metal, the oxygen, the nitrogen and the silicon and which includes 35 at % to 60 at % of the oxygen; and selectively etching the translucent phase shift film by the use of a photolithography technique to obtain the phase shift mask.

27. A method of manufacturing a phase shift manufacturing a phase shift mask, comprising the steps of:

preparing a substrate transparent to an exposure light beam and a target including metal and silicon;

locating the transparent substrate and the target within an atmosphere of a mixed gas which includes an oxygen gas and a nitrogen gas;

adjusting amounts of the oxygen and the nitrogen within the mixed gas so that a translucent phase shift film deposited has a ratio of nitrogen to oxygen which falls within the range between 0.2 and 0.5;

sputtering the target within the mixed gas adjusted onto the transparent substrate to deposit said translucent phase shift film which includes the metal, the oxygen, the nitrogen and the silicon and which includes the nitrogen and the oxygen at the above-mentioned ratio; and selectively etching the translucent phase shift film by the use of a photolithography technique to obtain the phase shift mask.

28. A method of manufacturing a phase shift mask, comprising the steps of:

preparing a substrate transparent to an exposure light beam and a target including metal and silicon;

locating the transparent substrate and the target within an atmosphere of a mixed gas which includes an oxygen gas and a nitrogen gas;

adjusting amounts of the oxygen and the nitrogen within the mixed gas so that a translucent phase shift film deposited has a sheet resistance between 20 and 200 K$\Omega$/□;

sputtering the target within the mixed gas adjusted onto the transparent substrate to deposit said translucent phase shift film including the metal, the oxygen, the nitrogen, and the silicon and which has the above-mentioned sheet resistance; and selectively etching the translucent phase shift film by the use of a photolithography technique to obtain the phase shift mask.

* * * * *